United States Patent [19]

Niwa

[11] Patent Number: 4,910,473

[45] Date of Patent: Mar. 20, 1990

[54] DIGITALLY TEMPERATURE-COMPENSATED OSCILLATOR

[75] Inventor: Shigeo Niwa, Sendai, Japan

[73] Assignee: Seiko Electronic Components Ltd., Japan

[21] Appl. No.: 214,448

[22] Filed: Jul. 1, 1988

[30] Foreign Application Priority Data

Jul. 2, 1987 [JP] Japan .............................. 62-165622
Oct. 1, 1987 [JP] Japan .............................. 62-248844

[51] Int. Cl.$^4$ .................................... H03L 1/00
[52] U.S. Cl. ...................................... 331/176; 331/66; 331/158
[58] Field of Search ................... 331/66, 158, 176, 47; 368/159, 200, 202

[56] References Cited

U.S. PATENT DOCUMENTS 4,453,834  6/1984  Suzuki et al. .................. 331/176 X

*Primary Examiner*—Eugene R. LaRoche
*Assistant Examiner*—Robert J. Pascal
*Attorney, Agent, or Firm*—Bruce L. Adams; Van C. Wilks

[57] ABSTRACT

A digitally temperature-compensated oscillator has an oscillator for producing a frequency signal, a regulator for regulating the frequency of the frequency signal, and a detector for detecting ambient temperature and producing a corresponding temperature signal. A processor processes the temperature signal with reference to the frequency signal to produce processed temperature data. A memory stores compensation data effective to regulate the frequency of the frequency signal. A controller operates according to the temperature data to retrieve corresponding compensation data from the memory for controlling the regulator according to the retrieved compensation data to regulate the frequency of the frequency signal.

7 Claims, 4 Drawing Sheets

DIGITALLY TEMPERATURE-COMPENSATED OSCILLATOR

BACKGROUND OF THE INVENTION

The present invention relates to a temperature-compensating device of digitally temperature compensated oscillator. Further, the present invention relates to a calibration device of a digitally compensated oscillator and more specifically, the to the input operation of calibration data effective to calibrate the oscillator by means of the calibration device.

According to the prior art, the oscillating frequency of an oscillator is regulated according to the information obtained from a temperature-detecting portion and corresponding compensation data stored in a memory portion. The temperature-detecting portion needs to have its own source of a reference signal and the reference signal requires a certain accuracy.

Further, according to the prior art, temperature characteristics of individual oscillators are measured and then written in the memory portion to carry out the calibration. However, the individual temperature characteristics of the oscillators are not identical. Therefore, it is necessary to measure oscillators individually. Further, calibration error of the temperature-detecting portion can not be eliminated.

SUMMARY OF THE INVENTION

In order to solve the above described first drawback of the prior art, according to the present invention, the output frequency of the oscillator is utilized for the reference signal of the temperature-detecting portion. By such a construction, the output of the temperature-detecting portion changes in response to the ambient temperature change, the output of the temperature-detecting portion is counted with reference to the output of the oscillator, and the output frequency of the main oscillator is regulated based on the counted output of the temperature-detecting portion according to the preset content of the memory portion. Then the regulated output of the oscillator is again utilized as the reference signal of the temperature-detecting portion so that the output frequency of the oscillator is more accurately controlled to obtain a stable oscillation with respect to the temperature change.

According to the present invention, the digitally temperature-compensated oscillator has a main oscillator and another oscillator for detecting a temperature. The frequency change of the detecting oscillator is measured with reference to a frequency generated in the main oscillator. A frequency-regulating portion is controlled according to a content preset in a memory portion and the measured frequency change so as to regulate the frequency of the main oscillator. The regulated frequency is used for the measurement of the frequency change of the detecting oscillator once again. The above described operation is repeated such that the frequency of the main oscillator is adjusted to a predetermined frequency so that the main oscillator produces a stable oscillating signal with respect to the temperature change.

According to the present invention, in order to solve the second drawback of the prior art, it is an object to accurately calibrate the oscillator as a whole under different temperatures without separately measuring the oscillating portion and temperature-detecting portion.

In order to solve the second drawback, according to the present invention, the oscillator has an oscillating portion, a comparing portion for comparing the frequency of the oscillating portion with the frequency of a calibration input, means for adjusting the frequency o the oscillating portion according to data from the comparing portion to equalize the frequency of the oscillating portion with the calibration input, and a memory portion for storing data from the temperature-detecting portion and data effective to regulate the frequency when the frequency of the oscillating portion coincides with the frequency of the calibration input. By such a construction, the oscillator can be accurately calibrated as a whole without separately measuring temperature characteristics of the oscillating portion and the detecting portion.

The digitally temperature-compensated oscillator is held at a given temperature and a calibration signal is applied to a calibration input terminal of the oscillator. The comparing portion compares the frequencies of the oscillating portion and calibration input with each other, and the regulating portion is controlled according to the compared result to equalize the frequency of the oscillating portion with that of the calibration input. At the same time, the control data and the data from the temperature detecting portion are memorized. By repeating such an operation at different temperatures, the oscillator can be calibrated to various temperature conditions.

DETAILED DESCRIPTION OF THE INVENTION

Figure 1:
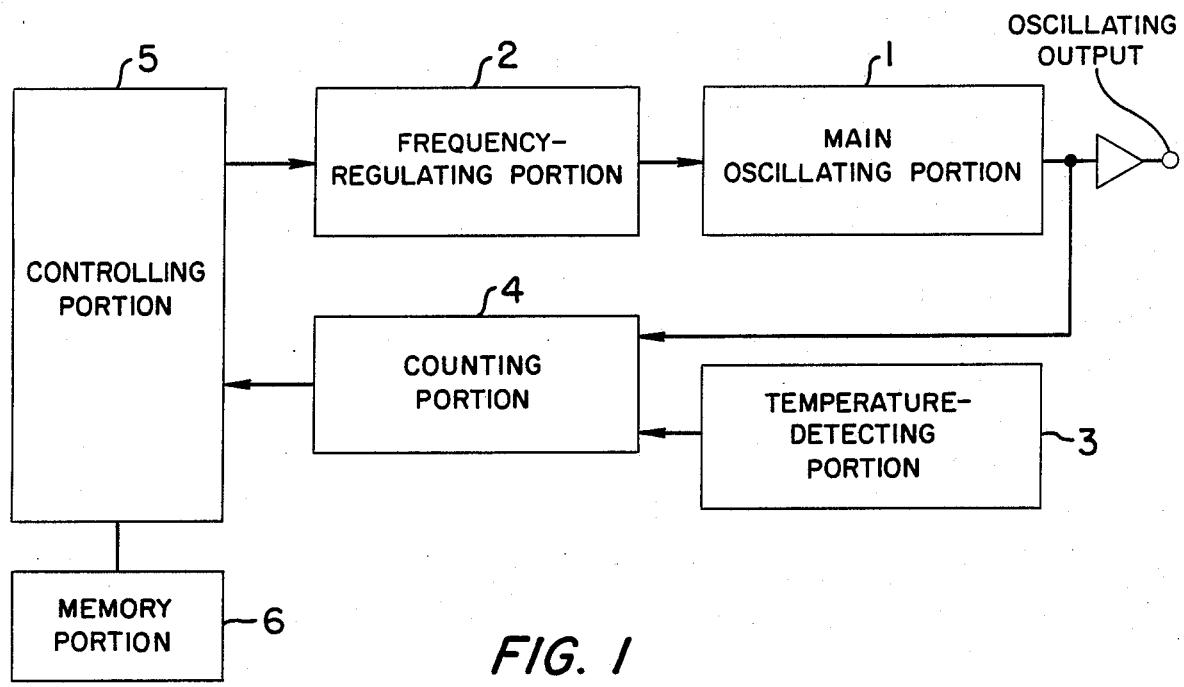
FIG. 1 is a circuit block of a digitally temperature-compensated oscillator according to the present invention.

Hereinafter, embodiments of the present invention in which quartz oscillators are utilized as a main oscillating portion and a temperature detecting portion will be described in conjunction with the drawings. As shown in FIG. 1, a frequency regulating portion 2 regulates on oscillating frequency of a main oscillating portion 1. An output of a temperature-detecting portion 3 is counted by a counting portion 4 with reference to the output of the main oscillating portion 1. The output of the counting portion 4 is inputted to a controlling portion 5, and the controlling portion 5 controls the frequency regulating portion 2 based on the output of the counting portion 4 according to preset content of a memory portion 6. The thus regulated output frequency of the main oscillating portion 1 is again utilized as a reference in the counting portion 4 for counting the output frequency of the temperature-detecting portion 3 so that the accuracy of the temperature-detection is increased. By repeating the above described operation, the frequency of the main oscillating portion 1 can be regulated to a desired frequency.

Figure 2:
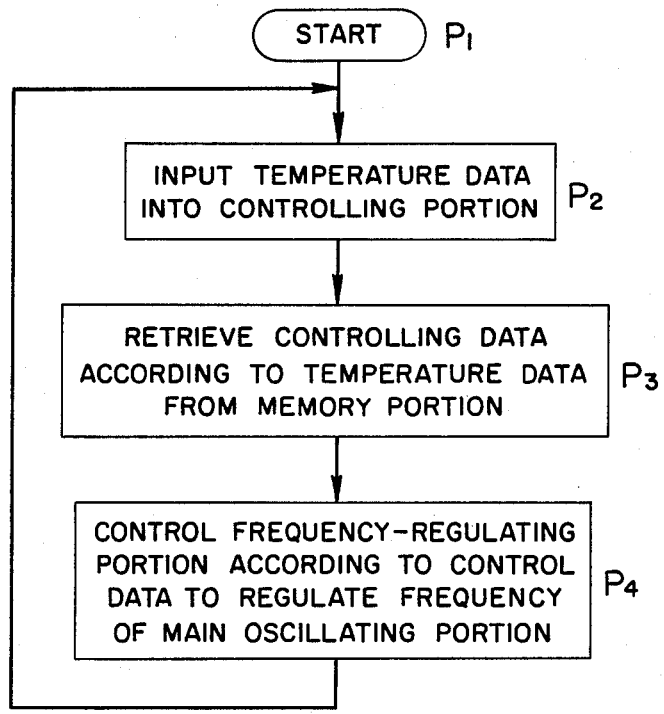
FIG. 2 is a flow chart showing operation of the oscillator of FIG. 1.

FIG. 2 shows a flow chart for executing the above described operation. In FIG. 2, P1–P4 denote respective steps of the flow chart. Firstly, in the step P2, the temperature information from the temperature-detecting portion is counted in the counting portion with reference to the frequency of the main oscillating portion, and the counted temperature information is inputted into the controlling portion. Next, in the step P3, the preset control data is retrieved from the memory portion according to the inputted temperature information. In the step P4, the frequency of the main oscillating portion is regulated by means of the frequency-regulating portion according to the control data selectively retrieved in the step P3. By repeating the steps P1–P4, the main oscillating portion oscillates accurately at a predetermined desired frequency under the fluctuating ambient temperature.

The main oscillating portion 1 oscillates at a variable frequency in response to ambient temperature. The temperature-detecting portion 3 detects the ambient temperature and produces a temperature-dependent frequency signal representative of the ambient temperature. The counting portion 4 counts the frequency signal with reference to the variable frequency of the main oscillating portion 1 to produce temperature data. However, the temperature data does not accurately represent the ambient temperature because the reference frequency is variable, but approximately indicates the ambient temperature. The controlling portion 5 retrieves corresponding compensation data from the memory portion 6 according to the approximate temperature data, the compensation data representing the amount of regulation needed to equalize the frequency of the frequency signal to that of a predetermined frequency. Therefore, the retrieved compensation data is also approximate. The controlling portion 5 controls the frequency-regulating portion 2 according to the approximate compensation data to regulate the frequency of the main oscillating portion 1. Thus the frequency of the main oscillating portion is approximately or coarsely regulated to a predetermined desired constant oscillating frequency. Then, the coarsely regulated frequency is utilized as the reference signal in the counting portion 4. At this time, the counted temperature data is more accurate because the reference signal is regulated close to the constant frequency. The controlling portion 5 retrieves more accurate compensation data according to the more accurate temperature data and controls the frequency-regulating portion 2 according to the more accurate compensation data to finely regulate the frequency of the main oscillating portion 1. By repeating the above operation, the variable frequency is finally regulated to the desired constant frequency.

Figure 3:
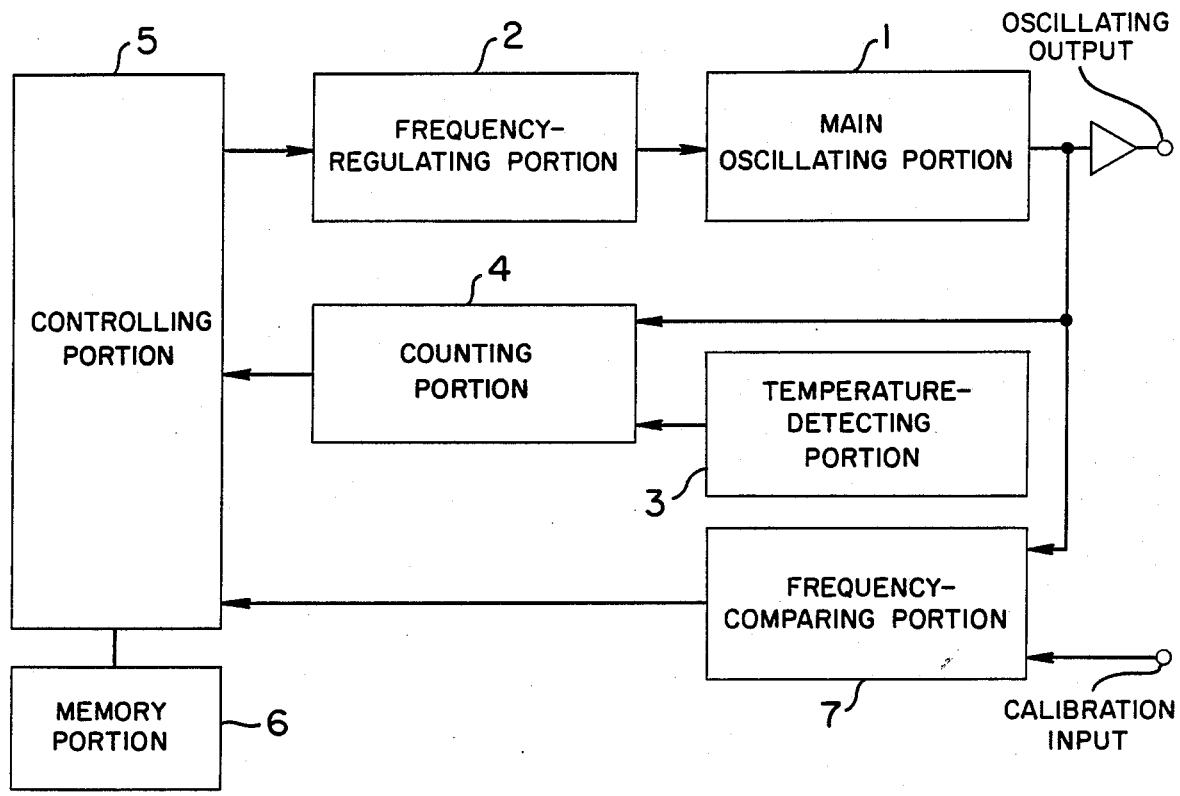
FIG. 3 is a circuit block of another embodiment according to the present invention.

FIG. 3 shows another embodiment of the present invention. As shown in FIG. 3, a controlling portion 5 controls a frequency-regulating portion 2. A counting portion 4 receives the frequency output of a main oscillating portion 1 and frequency output of a temperature-detecting portion 3 and counts the frequency output of the temperature-detecting portion 3 with reference to the frequency output of the main oscillating portion 1 to apply the counted result to the controlling portion 5. Further, the output of the main oscillating portion 1 is fed to a frequency-comparing portion 7 to compare the same with the frequency of a calibration input signal. The controlling portion 5 controls the frequency-regulating portion 2 according to the compared result between the calibration input signal and the output of the main oscillating portion 1 to thereby equalize the frequency of the main oscillating portion 1 with that of the calibration input signal. When the frequency of the main oscillating portion 1 coincides with that of the calibration input, data from the temperature-detecting portion 3 is counted with reference to the equalized frequency and is stored as temperature data in a memory portion 6. At the same time, the compensation data representative of the amount of regulation needed to enable the frequency-regulating portion 2 to equalize the frequency of the main oscillating portion 1 is stored in the memory portion 6. By such a construction, the calibration data effective to compensate the frequency of the main oscillating portion 1 for the temperature change is obtained.

Figure 4:
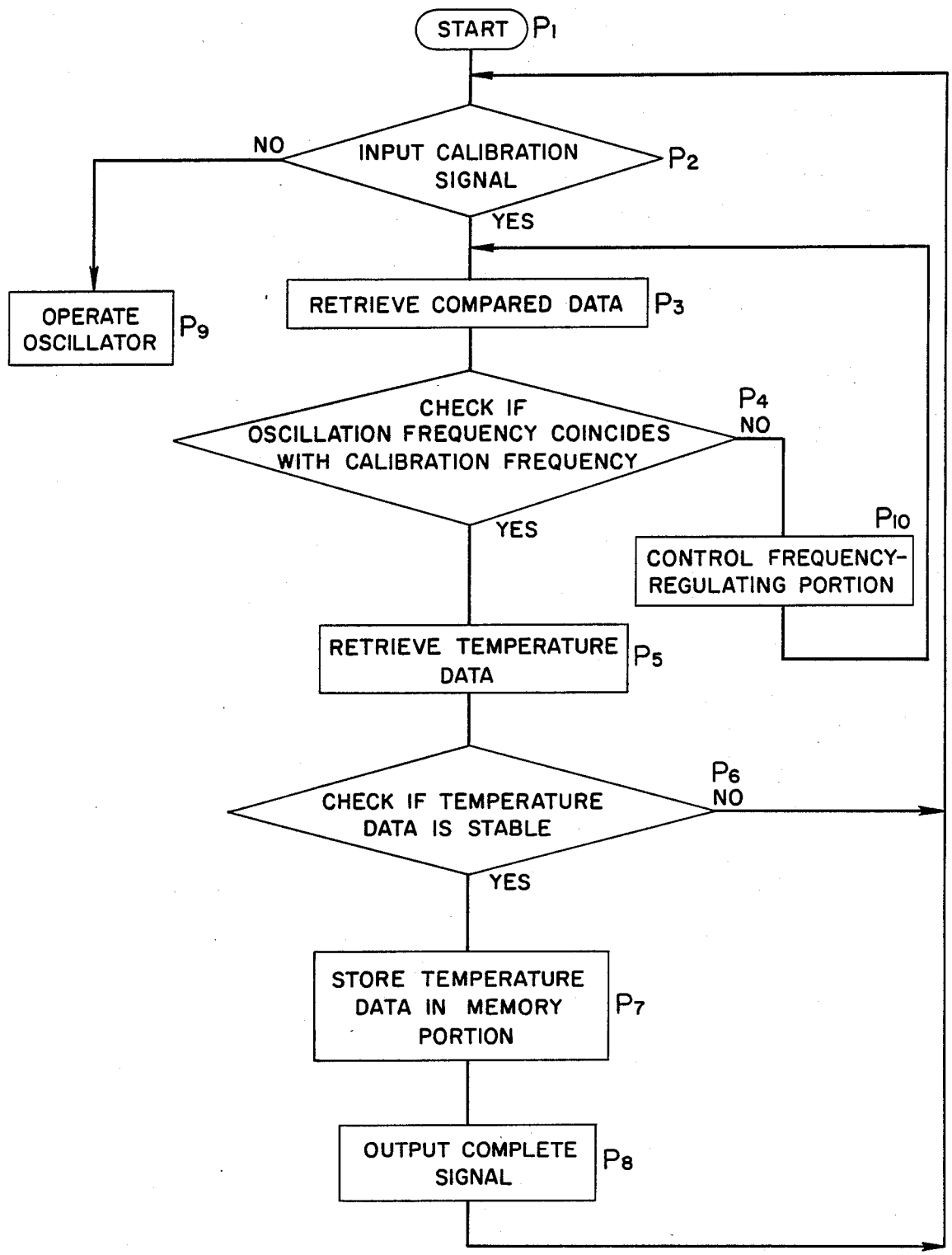
FIG. 4 is a flow chart showing control steps of the oscillator of FIG. 3.

FIG. 4 shows a flow chart to execute the above described control. In FIG. 4, P1–P10 denote respective steps of the flow chart. Memorization of the compensation data is carried out only when the calibration input is applied.

Firstly, in the step P2, when the calibration input is not applied, the digitally temperature-compensated oscillator effects the oscillation operation in the step P9. When the calibration input is applied in the step P2, on the other hand, the calibration input and the frequency of the main oscillating portion are compared with each other to determine whether these signals coincide with each other in the step P4. If the frequency of the main oscillating portion does not coincide with that of the calibration input, the frequency-regulating portion is controlled to change the frequency of the main oscillating portion in the step P10 to repeat the steps P3, P4 and P10 sequentially to thereby equalize the frequency of the main oscillating portion with that of the calibration input. If the frequency of the main oscillating portion coincides with that of the calibration input, the temperature data is applied from the temperature-detecting portion to the counting portion and is counted with reference to the equalized frequency of the main oscillating portion. The stability of the temperature data is checked through the steps P2–P6. If the stability of the temperature data is assured, the data from the temperature-detecting portion and the corresponding compensation data effective to regulate the frequency of the main oscillating portion are stored in the memory portion 6 in the step P7. The calibration at a given temperature is completed at this step. Then a step complete signal is produced in the step P8 to carry out another calibration at a different temperature. The calibration is repeated within the required temperature range so that the calibration data (the data from the temperature-detecting portion and the data effective to regulate the frequency of the main oscillating portion) are automatically stored in the memory portion.

As described above, the digitally temperature-compensated oscillator is provided with the calibration function so that a plurality of oscillators are calibrated at the same time, and that all variable elements of the oscillator are calibrated as a whole.

Figure 5:
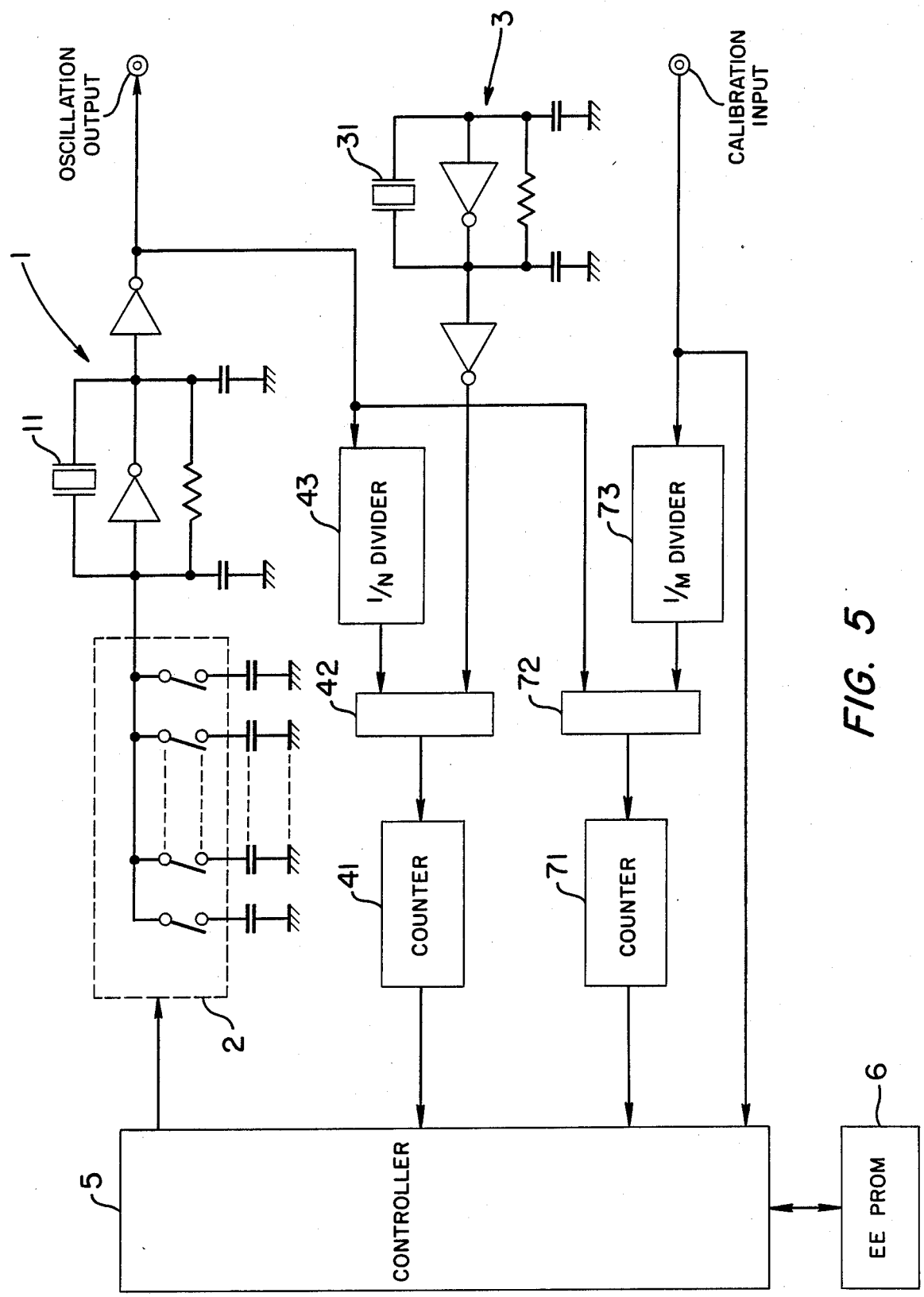
FIG. 5 is a detailed circuit diagram of the oscillator shown in FIG. 3.

FIG. 5 shows a detailed circuit structure of the digitally temperature-compensated oscillator with the automatic calibration. The frequency-regulating portion 2 is comprised of switched capacitors selectively turned on and off to regulate the frequency of the main oscillating portion 1. The main oscillating portion 1 is comprised of a quartz oscillator 11. The temperature-detecting portion 3 is comprised of a temperature-sensitive quartz oscillator 31. The counting portion 4 is comprised of a frequency counter 41, gate circuit 42 and a frequency divider 43 for dividing the frequency of the main oscillating portion 1 by a factor N. The frequency-comparing portion 7 is comprised of a frequency counter 71, a gate circuit 72 and a frequency divider 73 for dividing the calibration signal by a factor M.

What is claimed is:

1. In a digitally temperature-compensated oscillator having oscillating means for producing a frequency signal, regulating means for regulating the frequency of the frequency signal, and detecting means for detecting ambient temperature and producing a corresponding temperature signal, the improvement comprising:
   processing means for processing the temperature signal with reference to the frequency signal to produce processed temperature data;
   memory means for storing compensation data representative of regulation amounts needed to equalize the frequency of the frequency signal to that of a predetermined signal; and
   controlling means operative according to the temperature data to retrieve corresponding compensation data from the memory means for controlling the regulating means according to the regulation amount represented by the retrieved compensation data to regulate the frequency of the frequency signal.

2. In a digitally temperature-compensated oscillator having oscillating means for producing a frequency signal, regulating means for regulating the frequency of the frequency signal, and detecting means for detecting ambient temperature and producing corresponding temperature data, the improvement comprising:
   comparing means operative at a given ambient temperature for comparing the frequency of the frequency signal with that of a calibration signal to produce compared data;
   controlling means for controlling the regulating means, according to the compared data to equalize the frequency of the frequency signal to that of the calibration signal; and
   memory means for storing compensation data representative of a regulation amount needed to equalize the frequency of the frequency signal to that of the calibration signal and the temperature data.

3. A method of temperature-compensating an oscillator of the type which produces an output frequency which varies with changes in temperature so that the oscillator produces a stable output at a predetermined frequency, comprising the steps of:
   storing in a memory compensation data representative of different regulation amounts needed to equalize the oscillator output frequency so that of a predetermined frequency;
   detecting ambient temperature and producing a corresponding temperature-dependent frequency;
   comparing the oscillator output frequency with the temperature-dependent frequency and producing corresponding temperature data; and
   retrieving compensation data from the memory based on the temperature data and regulating the oscillator output frequency according to the regulation amount represented by the retrieved compensation data.

4. A method according to claim 3; including repeating the detecting, comparing and retrieving steps until the oscillator produces a stable output at the predetermined frequency.

5. A method of temperature-compensating an oscillator of the type which produces an output frequency which varies with changes in temperature so that the oscillator produces a stable output at a predetermined frequency, comprising the steps of:
   comparing the oscillator output frequency with a predetermined calibration frequency and producing corresponding compared data;
   regulating the oscillator output frequency according to the compared data to equalize the oscillator output frequency to that of the calibration frequency;
   detecting ambient temperature and producing a corresponding temperature-dependent frequency;
   comparing the equalized oscillator output frequency with the temperature-dependent frequency and producing corresponding temperature data; and
   storing in a memory the temperature data and compensation data representative of the regulation amount needed to equalize the oscillator output frequency to that of the calibration frequency at the detected ambient temperature.

6. A method according to claim 5; including changing the temperature of the oscillator to vary the output frequency thereof; and repeating the aforesaid steps at the changed temperature;

7. A method according to claim 5; including repeating the aforesaid steps while the oscillator is maintained at different respective temperatures to store in the memory temperature and compensation data for a range of temperatures.

* * * * *